(12) United States Patent
Blackwell, Jr.

(10) Patent No.: US 8,664,602 B2
(45) Date of Patent: Mar. 4, 2014

(54) WAFER-LEVEL INTRAPIXEL GETTER REFLECTOR WHOLE DIE ENCAPSULATION DEVICE AND METHOD

(75) Inventor: Richard J. Blackwell, Jr., Dracut, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 203 days.

(21) Appl. No.: 13/329,428

(22) Filed: Dec. 19, 2011

(65) Prior Publication Data
US 2013/0153766 A1    Jun. 20, 2013

(51) Int. Cl.
G01J 5/02        (2006.01)
(52) U.S. Cl.
USPC .................. 250/338.1; 250/339.02; 257/682; 438/55
(58) Field of Classification Search
USPC ............... 250/330, 332, 338.1, 338.3, 338.4, 250/339.02, 339.04, 349; 257/433, 682, 257/787; 438/55, 57, 69, 106, 127
See application file for complete search history.

(56) References Cited

U.S. PATENT DOCUMENTS

| | | | |
|---|---|---|---|
| 5,701,008 A * | 12/1997 | Ray et al. | ....................... 250/352 |
| 6,690,014 B1 | 2/2004 | Gooch et al. | |
| 6,753,526 B2 | 6/2004 | Vilain | |
| 8,395,229 B2 * | 3/2013 | Garcia-Blanco et al. | ..... 257/467 |
| 2002/0175284 A1 | 11/2002 | Vilain | |
| 2011/0141286 A1 | 6/2011 | Vilain | |
| 2012/0228733 A1 * | 9/2012 | Garcia-Blanco et al. | ..... 257/467 |

FOREIGN PATENT DOCUMENTS

FR      2822541 A1    9/2002

OTHER PUBLICATIONS

Rabaud, W. et al., "Recent Development in Pixel Level Packaging for Uncooled IRFPA", Proc. of SPIE, 2010, 8 pgs., vol. 7834.
Dumont, G. et al., "Pixel Level Packaging for Uncooled IRFPA", Proc. of SPIE, Apr. 25, 2011, 7 pages.

* cited by examiner

*Primary Examiner* — Mark R Gaworecki
(74) *Attorney, Agent, or Firm* — Maine Cernota & Rardin; David A. Rardin

(57) ABSTRACT

An apparatus and method for a wafer level vacuum package uncooled microbolometer focal plane array (FPA) on a wafer level substrate with a thin film getter-reflector (G-R). The G-R removes gas from the vacuum package and is reflective in the frequency band of the FPA. Sensor pixels are supported about a quarter-wavelength above the G-R which is within the perimeter of the imaging array. The package is evacuated through a single aperture, and vacuum is maintained for the lifetime of the FPA. Imaging sensor size is reduced while maintaining resolution by reducing non-imaging area.

20 Claims, 5 Drawing Sheets

SIMPLIFIED FOCAL PLANE ARRAY DIE HORIZONTAL CROSS-SECTION

SIMPLIFIED FOCAL PLANE GETTER LOCATION

SIMPLIFIED FOCAL PLANE ARRAY DIE HORIZONTAL CROSS-SECTION

PERSPECTIVE VIEW OF A SIMPLIFIED FOCAL PLANE ARRAY WAFER

TILED FOCAL PLANE ARRAY WITH REDUCED GAPS

FLOW CHART

WAFER-LEVEL INTRAPIXEL GETTER REFLECTOR WHOLE DIE ENCAPSULATION DEVICE AND METHOD

FIELD OF THE INVENTION

The present invention relates to high density focal plane arrays (FPAs), and more particularly, to microbolometer imaging arrays incorporating wafer-level multipurpose getter-reflectors (G-R).

BACKGROUND OF THE INVENTION

In wafer level vacuum packaging for microbolometers, a getter is used within the vacuum cavity to maintain low vacuum levels. The getter is currently placed in non-imaging areas of the focal plane so it does not interfere with the sensor operation. As refinements and innovative improvements are used to reduce the size of the overall focal plane array, the non-imaging area typically used for thin film getters become inadequate to maintain the package vacuum over the required lifetime of the sensor. A need exists for reduced thin film getter area in very small microbolometer arrays.

BRIEF SUMMARY OF THE INVENTION

To solve this problem, the functions of the thin film getter and the quarter wave reflector already in the pixel structure are combined. The thin film getter comprises generally opaque, reflective metals that can be used as the "reflector" material in microbolometer pixel structures. This allows the thin film getter material to be placed within the imaging array without degrading sensor performance and still providing gettering function as FPAs are miniaturized by reducing non-imaging areas. Therefore, the thin film getter is placed under the sensor pixels, providing sufficient area for the thin film getter to maintain package vacuum life.

Embodiments provide a wafer level vacuum package uncooled microbolometer focal plane array (FPA) device comprising a wafer level substrate; a getter-reflector (G-R) on the substrate, wherein the G-R comprises a material that removes gas from the vacuum package and the G-R material is reflective in frequency band of the FPA; a plurality of sensor pixels supported above the G-R by a plurality of pixel supports; a lid encapsulating the FPA; wherein the G-R is within perimeter of imaging array of the plurality of sensor pixels; and package vacuum is maintained for lifetime of the FPA; and whereby imaging sensor size is reduced while maintaining resolution by reducing non-imaging area. In other embodiments, the G-R is a thin film G-R, and separation between the plurality of sensor pixels and the G-R is about a quarter-wavelength in the frequency band of the FPA. For more embodiments, the substrate comprises at least one of a multiplexor and a read out integrated circuit (ROIC); and infrared reflectivity of the G-R maintains pixel sensitivity. In embodiments, a plurality of the sensor pixels of the device package are evacuated through a single aperture. In additional embodiments, the device package is evacuated by joining the lid to the FPA in a vacuum. For other embodiments, the FPA comprises a plurality of the wafers tiled adjacent each other; whereby the tiled FPA effective area imaging array has reduced gaps between individual sensors enabled by the G-R.

Further embodiments provide a method of forming a wafer level vacuum package uncooled microbolometer focal plane array (FPA) device comprising the steps of providing a wafer level substrate; forming a getter-reflector (G-R) on the substrate, wherein the G-R comprises a material that removes gas from the vacuum package and the G-R material is reflective in frequency band of the FPA; forming a plurality of sensor pixels on a sacrificial layer; removing the sacrificial layer, the plurality of sensor pixels supported above the G-R by a plurality of pixel supports; forming a package lid over the FPA; evacuating FPA package formed by the lid over the FPA; wherein the G-R is within perimeter of imaging array of the plurality of sensor pixels; and package vacuum is maintained for lifetime of the FPA; and whereby imaging sensor size is reduced while maintaining resolution by reducing non-imaging area. In other embodiments, the G-R is a thin film G-R; and separation between the plurality of sensor pixels and the G-R is about a quarter-wavelength in the frequency band of the FPA. For more embodiments, the evacuation of a plurality of the sensor pixels of the device package is through a single aperture, and in others the device package is evacuated by forming the package lid over the FPA in a vacuum. Additional embodiments further comprise the step of tiling a plurality of the wafers adjacent each other; whereby the tiled FPA effective area imaging array has reduced gaps between individual sensors enabled by the G-R; and the substrate comprises at least one of a multiplexor and a read out integrated circuit (ROIC). In continuing embodiments, infrared reflectivity of the G-R maintains pixel sensitivity; and the evacuation of the sensor pixels of the device package is through a plurality of apertures. More embodiments comprise a night vision system; and a thermal weapon sight.

Yet further embodiments provide a wafer level vacuum package uncooled microbolometer focal plane array (FPA) device comprising a wafer level substrate; a thin film getter-reflector (G-R) on the substrate, wherein the G-R comprises a material that removes gas from the vacuum package; a plurality of sensor pixels supported about a quarter-wavelength in the frequency band of the FPA above the G-R by a plurality of pixel supports; wherein the G-R is within perimeter of imaging array of the plurality of sensor pixels; the device package is evacuated through a single aperture; package vacuum is maintained for lifetime of the FPA; and whereby imaging sensor size is reduced while maintaining resolution by reducing non-imaging area.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention is further described with reference to the accompanying drawings wherein.

DETAILED DESCRIPTION OF THE INVENTION

In wafer level vacuum packaging for microbolometers a thin film getter is used within the vacuum cavity to maintain low vacuum levels.

Figure 1:
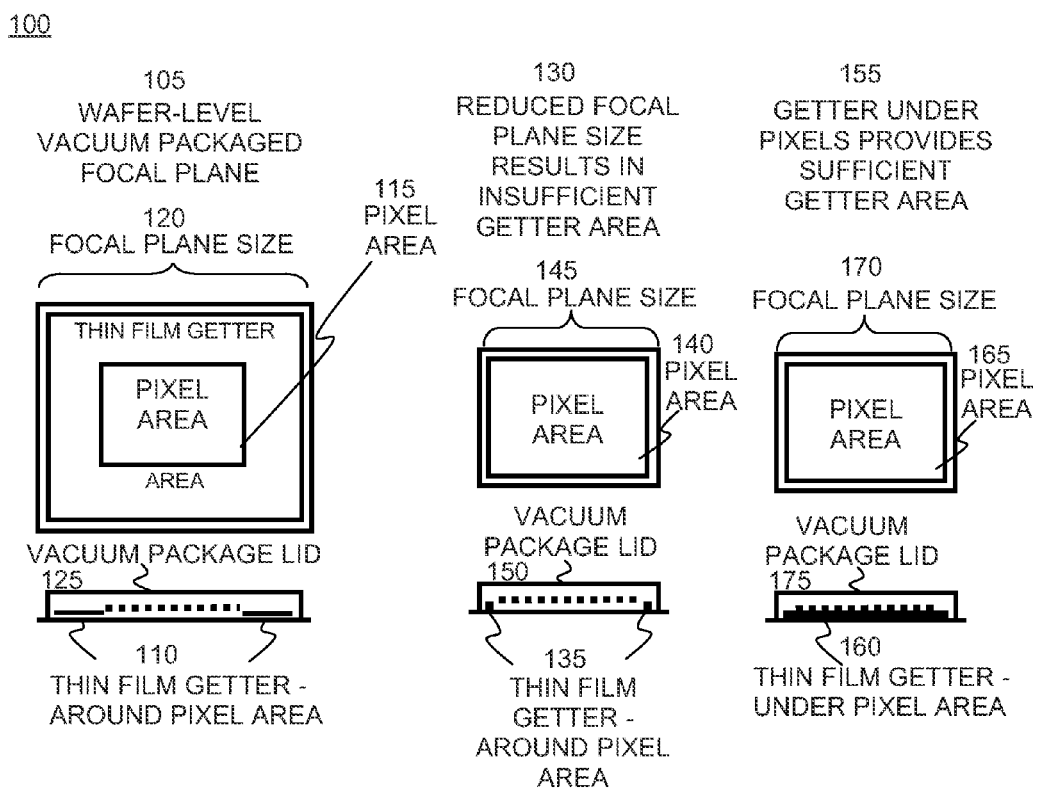
FIG. 1 depicts simplified focal plane getter location configured in accordance with an embodiment of the present invention.

FIG. 1 depicts getter locations in wafer-level focal plane packages 100. A first wafer-level vacuum packaged focal plane 105 includes thin film getter 110 around pixel area 115. This results in a larger focal plane size 120. Capping the focal plane is vacuum package lid 125. Second wafer-level vacuum packaged focal plane 130 includes thin film getter 135 around pixel area 140. This results in a smaller focal plane size 145; however, this results in insufficient getter area to provide reliable sub-atmospheric pressure operation beneath focal plane vacuum package lid 150. Third wafer-level vacuum packaged focal plane 155 includes thin film getter 160 under pixel area 165. This results in a smaller focal plane size 170 while providing sufficient getter area for reliable sub-atmospheric pressure operation beneath focal plane vacuum package lid 175. Thin film getters placed in non-imaging areas of the focal plane do not interfere with the sensor operation as depicted in first wafer-level vacuum packaged focal plane 105. It is desirable to reduce the size of the imaging sensor by reducing the amount of non-imaging area while maintaining the pixel count. This reduces overall product size and allows "tiling" sensors, as will be illustrated in FIG. 4, to form larger effective imaging arrays with minimal image gaps between individual sensors. As refinements and innovative improvements are used to reduce the size of the overall focal plane array, the non-imaging area typically used for thin film getters become inadequate to maintain the package vacuum over the required lifetime of the sensor.

By combining the functions of the thin film getter and the quarter wave reflector already in the pixel structure, reliable operation and high pixel density are both achieved. Using generally opaque, reflective thin film getter metals as the reflector material in microbolometer pixel structures allows the thin film getter material 160 to be placed within the imaging array 155 pixel area 165 without degrading sensor performance and still providing adequate gettering function as FPAs are miniaturized by reducing non-imaging areas.

Figure 2:
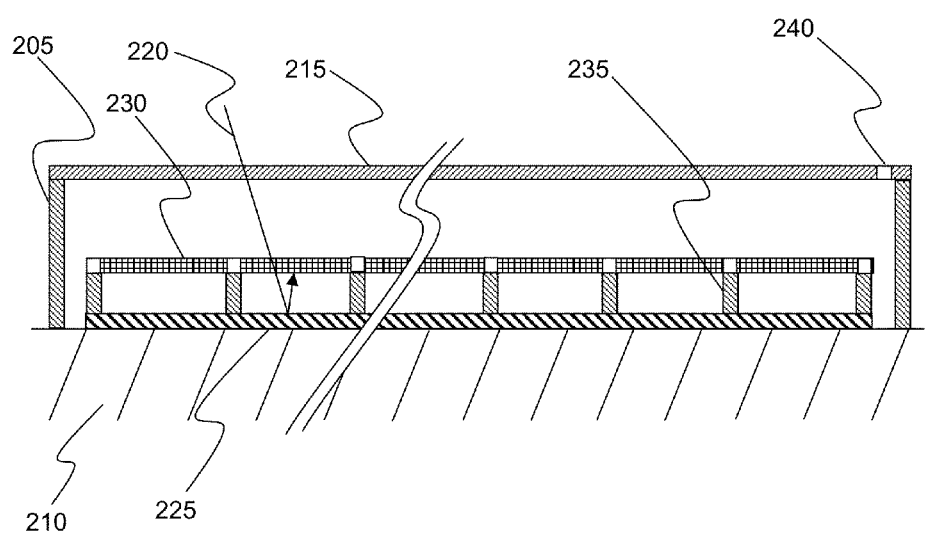
FIG. 2 is a simplified focal plane array die horizontal cross-section configured in accordance with an embodiment of the present invention.

FIG. 2 is a simplified focal plane array die horizontal cross-section 200. Vacuum package lid 205 on substrate 210 comprises transparent window 215. Incident radiation 220 is reflected by reflector-getter 225 back to sensor pixel 230. Sensor pixels 230 are suspended above reflector-getter 225 by supports 235. Vacuum package 205 is evacuated through aperture 240 or by bonding the lid and microbolometer in a vacuum.

Figure 3:
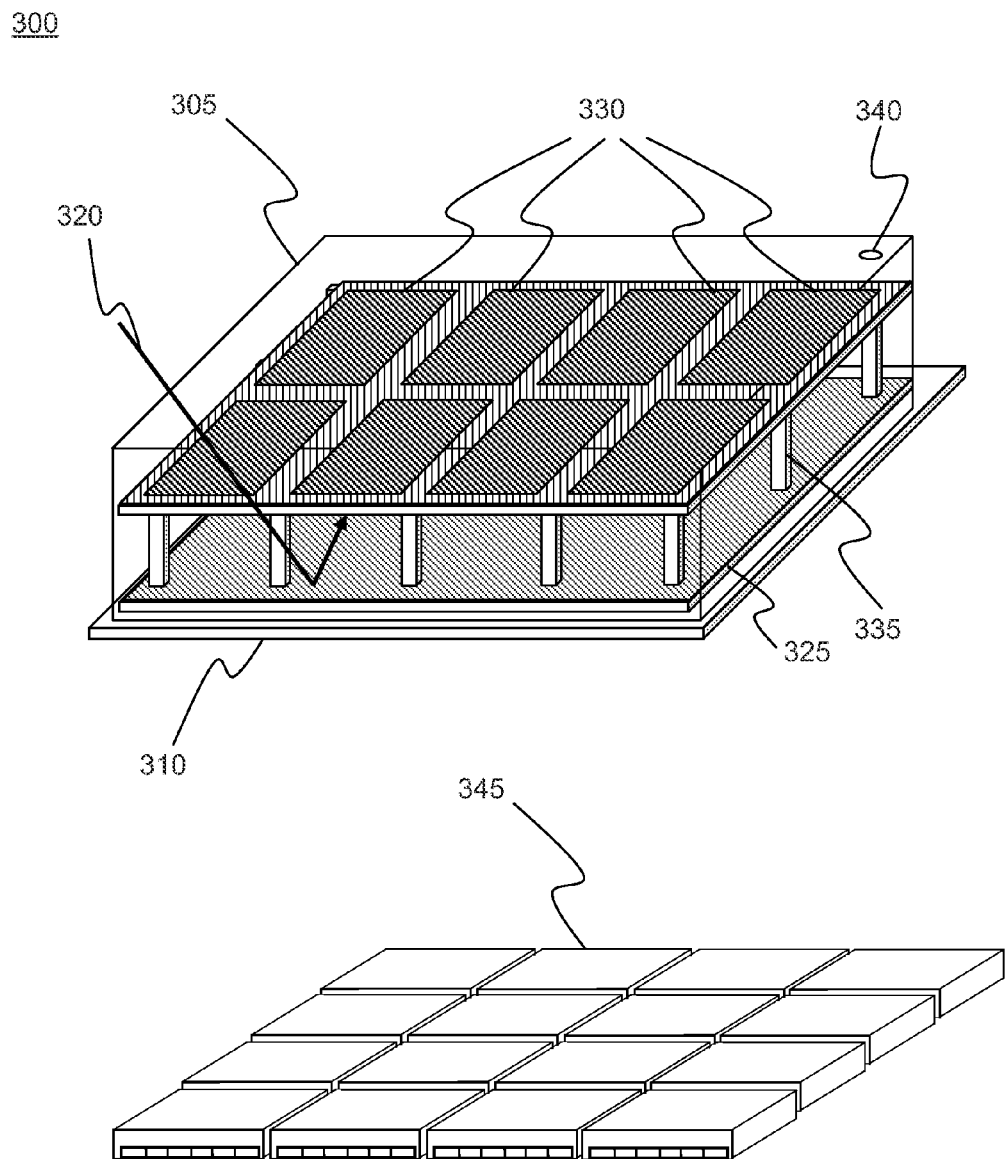
FIG. 3 is a perspective view of a simplified focal plane array wafer configured in accordance with an embodiment of the present invention.

FIG. 3 is a perspective view of a simplified focal plane array wafer 300. Vacuum package lid 305 is on substrate 310. Incident radiation 320 is reflected by reflector-getter 325 back to sensor pixel 330. Sensor pixels 330 are suspended above reflector-getter 325 by supports 335. Vacuum package 305 is evacuated through aperture 340. Die at time of encapsulation is depicted 345 comprising a plurality of arrays of FIG. 2.

Figure 4:
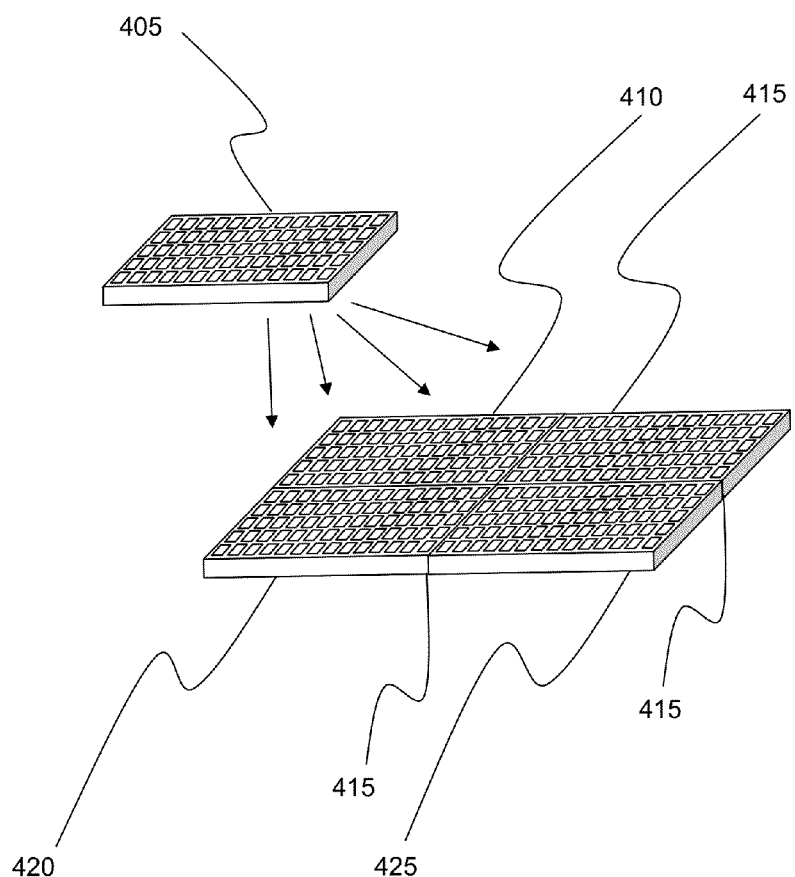
FIG. 4 is a perspective view of simplified tiled focal plane array with reduced gaps configured in accordance with an embodiment of the present invention.

FIG. 4 is a perspective view of simplified tiled focal plane array 400 with reduced gaps. Simplified depiction of focal plane array 405 illustrates result of tiling multiple (410, 415, 420, 425) FPAs having reduced gaps 415 due to elimination of dedicated getter around perimeter of each array. As stated, it is desirable to reduce the size of the imaging sensor by reducing the amount of non-imaging area while maintaining the pixel count. Overall product size is reduced, allowing tiled sensors to form larger effective imaging arrays with minimal image gaps between individual sensors.

Figure 5:
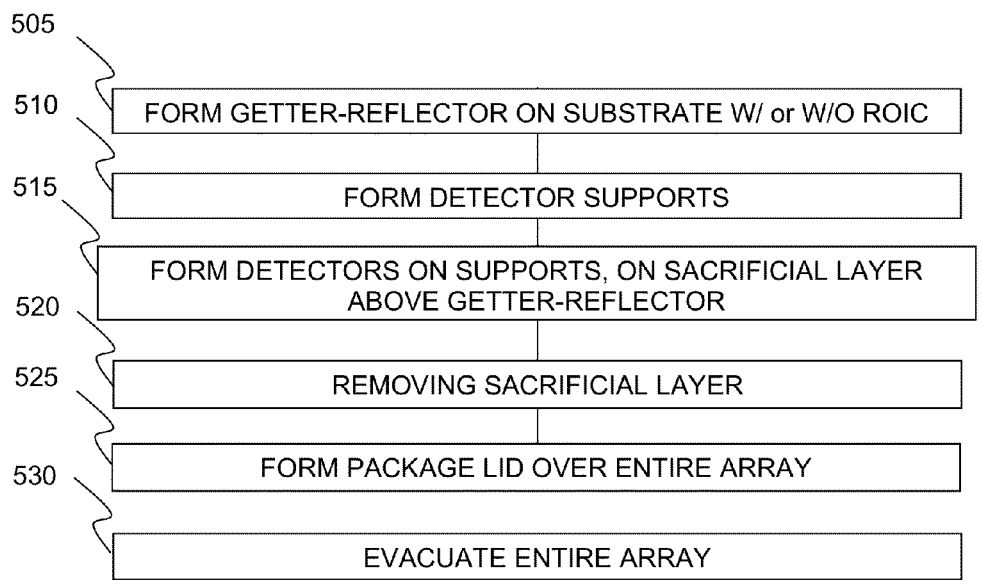
FIG. 5 is a flow chart of a method configured in accordance with an embodiment of the present invention.

FIG. 5 is a flow chart 500 of a method of forming a wafer level focal plane array. The steps of the method comprise forming the getter-reflector on the substrate 505 which may contain a multiplexor or Read Out Integrated Circuit (ROIC); forming detector supports 510; forming detectors on sacrificial layer 515; removing sacrificial layer 520; leaving detectors on the supports, above the getter-reflectors; forming the package lid 525; bonding the package lid over the detector array, in vacuum 530; alternatively, the package can be evacuated through an aperture.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A wafer level vacuum package uncooled microbolometer focal plane array (FPA) device comprising:
    a wafer level substrate;
    a getter-reflector (G-R) on said substrate, wherein said G-R comprises a material that removes gas from said vacuum package and said G-R material is reflective in frequency band of said FPA;
    a plurality of sensor pixels supported above said G-R by a plurality of pixel supports;
    a lid encapsulating said FPA;
    wherein said G-R is within perimeter of imaging array of said plurality of sensor pixels; and package vacuum is maintained for lifetime of said FPA; and
    whereby imaging sensor size is reduced while maintaining resolution by reducing non-imaging area.

2. The device of claim 1, wherein said G-R is a thin film G-R.

3. The device of claim 1, wherein separation between said plurality of sensor pixels and said G-R is about a quarter-wavelength in said frequency band of said FPA.

4. The device of claim 1, wherein said substrate comprises at least one of a multiplexor and a read out integrated circuit (ROIC).

5. The device of claim 1, wherein infrared reflectivity of said G-R maintains pixel sensitivity.

6. The device of claim 1, wherein a plurality of said sensor pixels of said device package are evacuated through a single aperture.

7. The device of claim 1, wherein said device package is evacuated by joining said lid to said FPA in a vacuum.

8. The device of claim 1, wherein said FPA comprises a plurality of said wafers tiled adjacent each other;
    whereby said tiled FPA effective area imaging array has reduced gaps between individual sensors enabled by said G-R.

9. A method of forming a wafer level vacuum package uncooled microbolometer focal plane array (FPA) device comprising the steps of:
    providing a wafer level substrate;
    forming a getter-reflector (G-R) on said substrate, wherein said G-R comprises a material that removes gas from said vacuum package and said G-R material is reflective in frequency band of said FPA;
    forming a plurality of sensor pixels on a sacrificial layer;

removing said sacrificial layer, said plurality of sensor pixels supported above said G-R by a plurality of pixel supports;

forming a package lid over said FPA;

evacuating FPA package formed by said lid over said FPA;

wherein said G-R is within perimeter of imaging array of said plurality of sensor pixels; and package vacuum is maintained for lifetime of said FPA; and whereby imaging sensor size is reduced while maintaining resolution by reducing non-imaging area.

10. The method of claim 9, wherein said G-R is a thin film G-R.

11. The method of claim 9, wherein separation between said plurality of sensor pixels and said G-R is about a quarter-wavelength in said frequency band of said FPA.

12. The method of claim 9, wherein said evacuation of a plurality of said sensor pixels of said device package is through a single aperture.

13. The method of claim 9, wherein said device package is evacuated by forming said package lid over said FPA in a vacuum.

14. The method of claim 9, further comprising the step of:

tiling a plurality of said wafers adjacent each other;

whereby said tiled FPA effective area imaging array has reduced gaps between individual sensors enabled by said G-R.

15. The method of claim 9, wherein said substrate comprises at least one of a multiplexor and a read out integrated circuit (ROIC).

16. The method of claim 9, wherein infrared reflectivity of said G-R maintains pixel sensitivity.

17. The method of claim 9, wherein said evacuation of said sensor pixels of said device package is through a plurality of apertures.

18. The method of claim 9, wherein said wafer level vacuum package uncooled microbolometer focal plane array (FPA) comprises a night vision system.

19. The method of claim 9, wherein said wafer level vacuum package uncooled microbolometer focal plane array (FPA) comprises a thermal weapon sight.

20. A wafer level vacuum package uncooled microbolometer focal plane array (FPA) device comprising:

a wafer level substrate;

a thin film getter-reflector (G-R) on said substrate, wherein said G-R comprises a material that removes gas from said vacuum package;

a plurality of sensor pixels supported about a quarter-wavelength in said frequency band of said FPA above said G-R by a plurality of pixel supports;

wherein said G-R is within perimeter of imaging array of said plurality of sensor pixels;

said device package is evacuated through a single aperture;

package vacuum is maintained for lifetime of said FPA; and whereby imaging sensor size is reduced while maintaining resolution by reducing non-imaging area.

* * * * *